(12) United States Patent
Lee et al.

(10) Patent No.: US 9,858,981 B2
(45) Date of Patent: Jan. 2, 2018

(54) SEMICONDUCTOR MEMORY DEVICES INCLUDING REDUNDANCY MEMORY CELLS

(71) Applicant: Samsung Electronics Co., Ltd., Suwon-si, Gyeonggi-do (KR)

(72) Inventors: Yun-Young Lee, Seongnam-si (KR); Kyo-Min Sohn, Yongin-si (KR); Sang-Joon Hwang, Seoul (KR); Sung-Min Seo, Seoul (KR); Sang-Bo Lee, Yongin-si (KR); Nak-Won Heo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/372,750

(22) Filed: Dec. 8, 2016

(65) Prior Publication Data

US 2017/0092349 A1    Mar. 30, 2017

Related U.S. Application Data

(63) Continuation of application No. 15/142,491, filed on Apr. 29, 2016, now Pat. No. 9,524,770, which is a continuation of application No. 14/503,691, filed on Oct. 1, 2014, now Pat. No. 9,336,906.

(30) Foreign Application Priority Data

Feb. 5, 2014    (KR) .................. 10-2014-0012837

(51) Int. Cl.
*G11C 17/00* (2006.01)
*G11C 11/406* (2006.01)
(Continued)

(52) U.S. Cl.
CPC ...... *G11C 11/40615* (2013.01); *G11C 11/408* (2013.01); *G11C 17/16* (2013.01); *G11C 29/44* (2013.01); *G11C 2029/4402* (2013.01)

(58) Field of Classification Search
CPC ............. G11C 11/1673; G11C 11/408; G11C 11/4087; G11C 29/04; G11C 29/44;
(Continued)

(56) References Cited

U.S. PATENT DOCUMENTS 5,828,619 A    10/1998    Hirano et al.
6,078,543 A *    6/2000    Kim .................. G11C 11/406
                                                    365/222

(Continued)

FOREIGN PATENT DOCUMENTS

KR    1020000050454 A    8/2000

*Primary Examiner* — Uyen B Tran
(74) *Attorney, Agent, or Firm* — Myers Bigel, P.A.

(57) ABSTRACT

A semiconductor memory device includes a memory cell array, a repair control circuit and a refresh control circuit. The memory cell array includes a plurality of memory cells and a plurality of redundancy memory cells. The repair control circuit receives a repair command and performs a repair operation on a first defective memory cell among the plurality of memory cells during a repair mode. The semiconductor memory device may operate in a repair mode in response to the repair command. The refresh control circuit performs a refresh operation on non-defective ones of the plurality of memory cells during the repair mode.

17 Claims, 12 Drawing Sheets

(51) Int. Cl.
*G11C 17/16* (2006.01)
*G11C 11/408* (2006.01)
*G11C 29/44* (2006.01)

(58) Field of Classification Search
CPC .............. G11C 29/4401; G11C 29/783; G11C 11/40611; G11C 11/40615; G11C 17/165; G11C 17/16
See application file for complete search history.

(56) References Cited

U.S. PATENT DOCUMENTS

| | | |
|---|---|---|
| 2002/0001246 A1 | 1/2002 | Hidaka |
| 2002/0181301 A1 | 12/2002 | Takahashi et al. |
| 2003/0169634 A1 | 9/2003 | Kilmer et al. |
| 2005/0052928 A1 | 3/2005 | Koshikawa |
| 2005/0162945 A1 | 7/2005 | Kang et al. |
| 2007/0002656 A1 | 1/2007 | An |
| 2008/0043549 A1 | 2/2008 | Kim |
| 2009/0109773 A1 | 4/2009 | Abe |
| 2009/0201752 A1 | 8/2009 | Riho et al. |
| 2011/0085396 A1 | 4/2011 | Bang et al. |
| 2011/0267899 A1 | 11/2011 | Kim et al. |
| 2012/0106277 A1* | 5/2012 | Kwean .............. G11C 11/40622 365/194 |
| 2012/0263001 A1 | 10/2012 | Wong et al. |
| 2012/0297241 A1 | 11/2012 | Jeddeloh |
| 2014/0301150 A1* | 10/2014 | Yoon ................... G11C 29/789 365/203 |
| 2016/0035438 A1* | 2/2016 | Kim ................... G11C 29/4401 365/96 |

\* cited by examiner

SEMICONDUCTOR MEMORY DEVICES INCLUDING REDUNDANCY MEMORY CELLS

CROSS-REFERENCE TO RELATED APPLICATION

This application is a continuation of U.S. patent application Ser. No. 15/142,491, filed Apr. 29, 2016, now U.S. Pat. No. 9,524,770, which is a continuation of U.S. patent application Ser. No. 14/503,691, filed Oct. 1, 2014, now U.S. Pat. No. 9,336,906, which claims priority under 35 USC §119 to Korean Patent Application No. 10-2014-0012837, filed on Feb. 5, 2014 in the Korean Intellectual Property Office (KIPO), the contents of which are herein incorporated by reference in their entirety.

BACKGROUND

1. Technical Field

Example embodiments relate generally to semiconductor memory devices, and more particularly to semiconductor memory devices that perform repair and refresh operations.

2. Description of the Related Art

A semiconductor memory device may include redundancy memory cells that can be used to repair defective memory cells. When an address of the defective memory cell is input to the semiconductor memory device, a repair operation may be performed by cutting off a normal path and by activating a redundancy path to the redundancy memory cell. In addition, in a volatile memory device, which is a type of the semiconductor memory device, a refresh operation may be performed to retain data stored in memory cells. The semiconductor memory device may include a repair circuit that performs the repair operation and/or a refresh circuit that performs the refresh operation.

SUMMARY

Accordingly, the inventive concept is provided to substantially obviate one or more problems due to limitations and disadvantages of the related art.

Some example embodiments provide a semiconductor memory device capable of efficiently performing a refresh operation.

Some example embodiments provide a semiconductor memory device capable of efficiently performing a repair operation.

According to example embodiments, a semiconductor memory device includes a memory cell array, a repair control circuit and a refresh control circuit. The memory cell array includes a plurality of memory cells and a plurality of redundancy memory cells. The repair control circuit receives a repair command and performs a repair operation on a first defective memory cell among the plurality of memory cells during a repair mode. The semiconductor memory device operates in the repair mode in response to the repair command. The refresh control circuit performs a refresh operation on normal (i.e., non-defective) memory cells among the plurality of memory cells except the first defective memory cell during the repair mode.

In an example embodiment, the refresh operation may be a self-refresh operation that is internally performed in response to a repair start signal generated in response to the repair command.

The refresh control circuit may include a self-refresh detection unit, a refresh period control unit and a refresh counter. The self-refresh detection unit may generate a self-refresh start signal in response to the repair start signal. The refresh period control unit may generate a refresh period control signal in response to the repair start signal and the self-refresh start signal. The refresh counter may generate a refresh address in response to the repair start signal and the refresh period control signal and may generate a refresh exit signal indicating that the self-refresh operation is completed.

A refresh period required to perform the self-refresh operation may be reduced in response to the refresh period control signal. The self-refresh operation may be performed on the normal (non-defective) memory cells based on the refresh address and the reduced refresh period.

The repair control circuit may include a repair start signal generation unit, a repair unit and a command control unit. The repair start signal generation unit may generate the repair start signal in response to the repair command. The repair unit may perform the repair operation on the first defective memory cell in response to the repair start signal and the refresh exit signal and may generate a repair exit signal indicating that the repair operation is completed. The command control unit may block other commands except the repair command in response to the repair start signal and may unblock the other commands in response to the repair exit signal.

The repair unit may include a plurality of anti-fuses. The repair operation may be performed by programming a first anti-fuse among the plurality of anti-fuses such that a first redundancy memory cell among the plurality of redundancy memory cells is accessed when it is requested to access the first defective memory cell.

In an example embodiment, the refresh operation may be an auto-refresh operation that is performed in response to an auto-refresh command.

The refresh control circuit may include a refresh period control unit and a refresh counter. The refresh period control unit may generate a refresh period control signal in response to the auto-refresh command and a repair start signal generated in response to the repair command. The refresh counter may generate a refresh address in response to the repair start signal and the refresh period control signal.

In an example embodiment, the semiconductor memory device may perform the refresh operation before the semiconductor memory device starts to perform the repair operation, or the semiconductor memory device may perform a part of the refresh operation before the semiconductor memory device starts to perform the repair operation and may perform a rest of the refresh operation after the repair operation is completed.

According to example embodiments, a semiconductor memory device includes a memory cell array, an error detection circuit and a repair control circuit. The memory cell array includes a plurality of memory cells and a plurality of redundancy memory cells. The error detection circuit detects a first defective memory cell among the plurality of memory cells. The repair control circuit performs a repair operation on the first defective memory cell during a first operation mode of the semiconductor memory device.

In an example embodiment, the repair control circuit may include a plurality of anti-fuses. The repair operation may indicate a hard repair operation that is performed to store repair information associated with the first defective memory cell by programming a first anti-fuse among the plurality of anti-fuses such that a first redundancy memory cell among the plurality of redundancy memory cells is accessed when it is requested to access the first defective memory cell.

The repair control circuit may include a mode detection unit, a program control unit, a fuse unit, a sensing control unit and a storage unit. The mode detection unit may detect the first operation mode to generate a repair enable signal. The program control unit may generate a program signal in response to the repair enable signal and first fail cell information corresponding to the first defective memory cell. The fuse unit may include the plurality of anti-fuses and may program the first anti-fuse in response to the program signal. The sensing control unit may verify whether the first anti-fuse is programmed properly. The storage unit may store the repair information based on states of the plurality of anti-fuses. The repair information may include the first fail cell information and first redundancy cell information corresponding to the first redundancy memory cell.

In an example embodiment, the repair control circuit may include a plurality of anti-fuses. The repair operation may indicate a soft repair operation that is performed to store repair information associated with the first defective memory cell without programming a first anti-fuse among the plurality of anti-fuses such that a first redundancy memory cell among the plurality of redundancy memory cells is accessed when it is requested to access the first defective memory cell.

The repair control circuit may include a plurality of storage units, a fuse unit and a sensing control unit. The fuse unit may include the plurality of anti-fuses and may generate a first signal indicating whether a first storage unit among the plurality of storage units is usable. The sensing control unit may provide first fail cell information to the first storage unit in response to the first signal when it is determined that the first storage unit is usable. The first fail cell information may correspond to the first defective memory cell.

In an example embodiment, the first operation mode may be a self-refresh mode or an auto-refresh mode.

Accordingly, the semiconductor memory device according to example embodiments may perform the repair operation on the first defective memory cell during the repair mode and may perform the refresh operation on the normal (non-defective) memory cells during the repair mode. Thus, the loss of data stored in the normal memory cells may be prevented while the first defective memory cell is repaired in the repair mode, and thus the semiconductor memory device may have a relatively improved data retention performance.

In addition, the semiconductor memory device according to example embodiments may perform the repair operation on the first defective memory cell during, not the conventional repair mode, but the first operation mode (e.g., the refresh mode). Thus, the semiconductor memory device may have a relatively improved data reliability performance in a data write and/or read operation.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
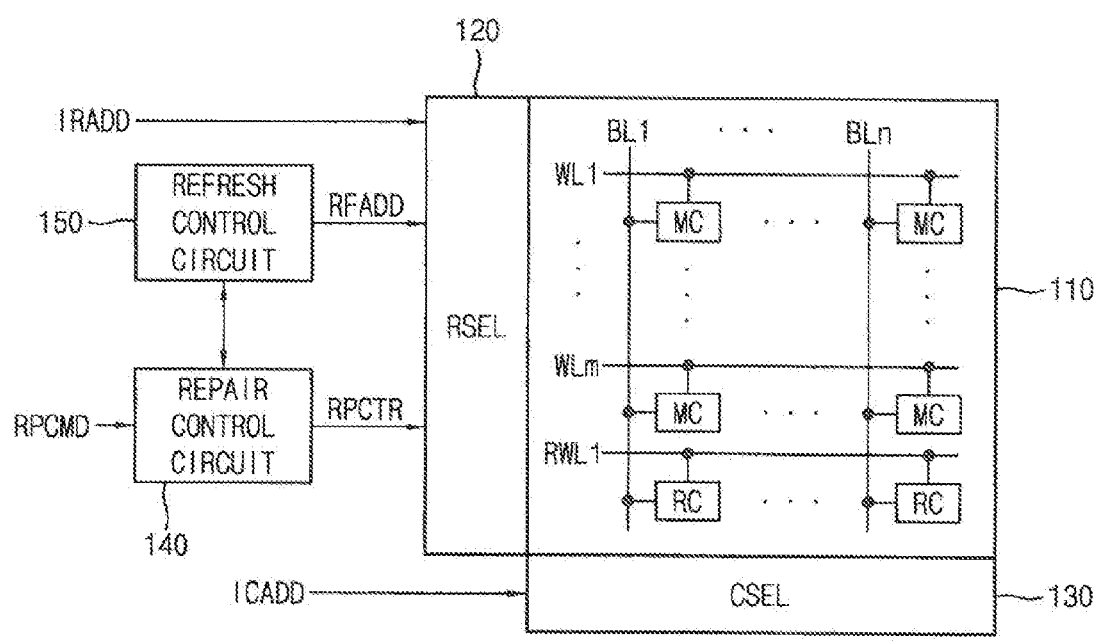
FIG. 1 is a block diagram illustrating a semiconductor memory device according to some embodiments.

Various embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Typically, in a semiconductor memory device, a defective memory cell may be replaced with a redundancy memory cell based on a repair operation. The repair operation may be categorized as a row repair operation and a column repair operation. In the row repair operation, a defective row including the defective memory cell in a memory cell array may be replaced with a redundancy row including the redundancy memory cell. In the column repair operation, a defective column including the defective memory cell in the memory cell array may be replaced with a redundancy column including the redundancy memory cell.

Hereinafter, a semiconductor memory device according to example embodiments will be described as repairing a defective memory cell based on the row repair operation, however, the inventive concepts may not be limited thereto and may be applied to an example where the defective memory cell is repaired based on the column repair operation.

In addition, hereinafter, a semiconductor memory device according to example embodiments will be described as a volatile memory device that performs a refresh operation to retain stored data.

FIG. 1 is a block diagram illustrating a semiconductor memory device according to some embodiments.

Referring to FIG. 1, a semiconductor memory device 100 includes a memory cell array 110, a repair control circuit 140 and a refresh control circuit 150. The semiconductor memory device 100 may further include a row selection circuit 120 and a column selection circuit 130.

The memory cell array 110 includes a plurality of memory cells MC and a plurality of redundancy memory cells RC. Although a single redundancy memory cell RC is illustrated on each bit line, more than one redundancy memory cell RC may be provided on each bit line in some embodiments. Moreover, although each bit line in FIG. 1 is illustrated as including a redundancy memory cell RC, in some embodiments not every bit line may include a redundancy memory cell RC. The plurality of memory cells MC may be connected to a plurality of bitlines BL1, . . . , BLn and a plurality of wordlines WL1, . . . , WLm, respectively. The plurality of redundancy memory cells RC may be connected to the plurality of bitlines BL1, . . . , BLn and a redundancy wordline RWL1, respectively. The memory cells MC and the redundancy memory cells RC may share the bitlines BL1, . . . , BLn to be accessed using the common column addresses, respectively.

Although FIG. 1 illustrates n bitlines BL1, . . . , BLn, where n is a natural number equal to or greater than two, m wordlines WL1, . . . , WLm, where m is a natural number equal to or greater than two, and one redundancy wordline RWL1 for convenience of illustration, the numbers of the bitlines, the wordlines and the redundancy wordlines may be varied.

The repair control circuit 140 receives a repair command RPCMD, which may be issued, for example, by a host, a memory controller, an external processor, etc. The semiconductor memory device 100 operates in a repair mode in response to the repair command RPCMD. For example, the repair command RPCMD may be provided from outside of the semiconductor memory device 100. During the repair mode, the repair control circuit 140 may perform a repair operation on a first defective memory cell among the plurality of memory cells MC. The repair control circuit 140 may generate a repair control signal RPCTR that is used for accessing the memory cell array 110 after the repair operation is completed.

In some embodiments, the repair operation may be a post package repair (PPR) operation that is performed after the semiconductor memory device 100 is packaged. The PPR operation may be performed by programming (e.g., rupturing) at least one fuse (e.g., at least one anti-fuse) among a plurality of fuses (e.g., a plurality of anti-fuses) included in the repair control circuit 140. The PPR operation may be referred to as a repair-on-system (RoS) operation.

As will be appreciated, both fuses and anti-fuses are devices that are either electrically conductive (low resistance) or electrically non-conductive (high resistance). A fuse starts with a low resistance and is designed to permanently break an electrically conductive path (typically when a current through the fuse exceeds a threshold amount). Similarly, an anti-fuse starts with a high resistance and is designed to permanently create an electrically conductive path when programmed. Either a fuse or an anti-fuse may be used in a repair circuit depending on the design of the repair circuit in question.

According to some embodiments, the first defective memory cell may be a hard defective cell or a soft defective cell. A hard defective cell may have a relatively critical and permanent defect, such as a defect that causes a data retention time of a memory cell to be reduced due to a characteristic of a variable retention time (VRT). A soft defective cell may have a relatively uncritical and/or temporary defect.

During the repair mode, the refresh control circuit 150 performs a refresh operation on normal memory cells MCMC other than the first defective memory cell. The refresh control circuit 150 may generate a refresh address RFADD, and the refresh operation may be performed based on the refresh address RFADD.

In some embodiments, the refresh operation may be a hidden refresh operation that is performed during a relatively short period of time (compared to a conventional refresh operation). The refresh operation may be performed before the semiconductor memory device 100 starts to perform the repair operation and/or after the repair operation is completed. In some embodiments, the refresh operation may be a self-refresh operation (e.g., a hidden self-refresh operation) that is performed only based on the repair command RPCMD and without requiring other commands, such as other commands from a memory controller or host. In other embodiments, the refresh operation may be an auto-refresh operation (e.g., a hidden auto-refresh operation) that is performed in response to the repair command RPCMD and in response to an auto-refresh command provided from the outside of the semiconductor, memory device 100.

The row selection circuit 120 may select one of the wordlines WL1, . . . , WLm and the redundancy wordline RWL1 based on an input row address IRADD, the refresh address RFADD or the repair control signal RPCTR. For example, in a data write operation or a data read operation, the row selection circuit 120 may select one of the wordlines WL1, . . . , WLm based on the input row address IRADD or may select the redundancy wordline RWL1 in response to the repair control signal RPCTR. For another example, in the refresh operation, the row selection circuit 120 may select one of the wordlines WL1, . . . , WLm and the redundancy wordline RWL1 in response to the refresh address RFADD. The row selection circuit 120 may include a row decoder, a wordline driver circuit, etc.

The column selection circuit 130 may select one of the bitlines BL1, . . . , BLn based on an input column address ICADD. The column selection circuit 130 may include a gating circuit, a column decoder, etc.

Although FIG. 1 illustrates an example where the repair control circuit 140 is located external to the row selection circuit 120, in other embodiments, the repair control circuit 140 may be located internal to the row selection circuit 120. In addition, although not illustrated in FIG. 1, the semiconductor memory device 100 may further include an error detection circuit that detects the first defective memory cell. For example, the error detection circuit may be an error checking and correction (ECC) circuit or a built-in self test (BIST) circuit.

To repair defective memory cells that are detected after a packaging process, a semiconductor memory device 100 according to some embodiments may perform a PPR operation on the first defective memory cell during the repair mode and may perform a hidden refresh operation on memory cells other than the first defective memory cell during the repair mode. Accordingly, the loss of data stored in the normal memory cells due to a leakage current may be prevented while the first defective memory cell is repaired in the repair mode, and thus the semiconductor memory device 100 may have a relatively improved data retention performance.

Figure 2:
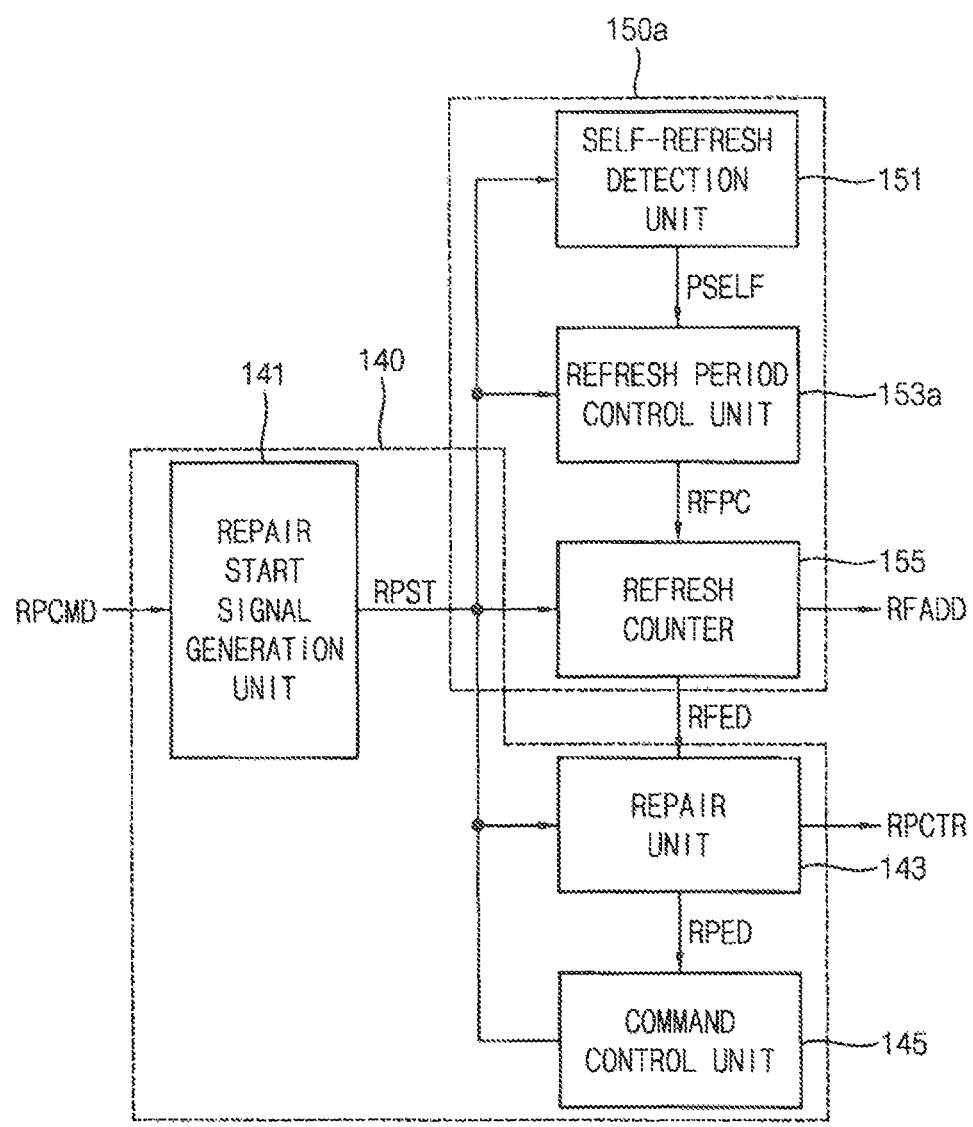
FIG. 2 is a block diagram illustrating an example of a repair control circuit and an example of a refresh control circuit included in the semiconductor memory device of FIG. 1.

FIG. 2 is a block diagram illustrating an example of a repair control circuit and an example of a refresh control circuit included in the semiconductor memory device of FIG. 1.

As described above with reference to FIG. 1, the refresh operation that is performed during the repair mode may be a hidden refresh operation. In addition, in some embodiments, the refresh operation may be a self-refresh operation that is performed internally in response to a repair start signal RPST generated in response to the repair command RPCMD. In other words, in the example embodiment of FIG. 2, the refresh operation may be a hidden self-refresh operation that is performed only in response to a repair command RPCMD and without other commands.

Referring to FIG. 2, a refresh control circuit 150a may include a self-refresh detection unit 151, a refresh period control unit 153a and a refresh counter 155.

The self-refresh detection unit 151 may generate a self-refresh start signal PSELF in response to the repair start signal RPST. For example, the self-refresh detection unit 151 may activate the self-refresh start signal PSELF when the repair start signal RPST is activated in response to the repair command RPCMD. The semiconductor memory device 100 of FIG. 1 may start to perform the self-refresh operation (e.g., the hidden self-refresh operation) in response to the activated self-refresh start signal PSELF. Configuration of the self-refresh detection unit 151 will be described in detail with reference to FIG. 3.

The refresh period control unit 153a may generate a refresh period control signal RFPC in response to the repair start signal RPST and the self-refresh start signal PSELF. For example, the refresh period control unit 153a may generate the refresh period control signal RFPC when both the repair start signal RPST and the self-refresh start signal PSELF are activated. A self-refresh period (e.g., a hidden self-refresh period) required to perform the self-refresh operation (e.g., the hidden self-refresh operation) may be reduced based on the refresh period control signal RFPC. In other words, the period of time that is required to perform the hidden self-refresh operation may be shorter than the time that is required to perform a conventional self-refresh operation.

The refresh counter 155 may generate a refresh address RFADD in response to the repair start signal RPST and the refresh period control signal RFPC. The self-refresh operation (e.g., the hidden self-refresh operation) may be performed on the normal memory cells based on the refresh address RFADD and the reduced self-refresh period (e.g., the hidden self-refresh period). In addition, the refresh counter 155 may generate a refresh exit signal RFED indicating that the self-refresh operation (e.g., the hidden self-refresh operation) is completed. For example, the refresh counter 155 may activate the refresh exit signal RFED when the hidden self-refresh operation is completed.

In some embodiments, the self-refresh operation (e.g., the hidden self-refresh operation) may be performed by selecting one of the plurality of wordlines WL1, . . . , WLm in FIG. 1, writing data stored in selected memory cells connected to the selected wordline into a storage unit (not illustrated), and rewriting the data stored in the storage unit into the selected memory cells. In this case, the semiconductor memory device 100 of FIG. 1 may further include a storage unit (e.g., a latch unit). In other embodiments, the self-refresh operation (e.g., the hidden self-refresh operation) may be performed by selecting one of the plurality of wordlines WL1, . . . , WLm in FIG. 1, by selecting the redundancy wordline RWL1 in FIG. 1, and by directly writing data stored in selected memory cells connected to the selected wordline into redundancy memory cells connected to the redundancy wordline RWL1 in FIG. 1. The self-refresh operation is widely known to those skilled in the art.

The repair control circuit 140 may include a repair start signal generation unit 141, a repair unit 143 and a command control unit 145.

The repair start signal generation unit 141 may generate the repair start signal RPST in response to the repair command RPCMD. For example, the repair start signal generation unit 141 may activate the repair start signal RPST when the repair command RPCMD is provided from the outside of the semiconductor memory device 100 of FIG. 1 (e.g., from an external memory controller and/or an external processor or host).

The repair unit 143 may perform a repair operation on the first defective memory cell based on the repair start signal RPST and the refresh exit signal RFED. For example, the repair unit 143 may include a plurality of anti-fuses, and the repair operation may be performed by programming a first one of the plurality of anti-fuses. The first anti-fuse may correspond to the first defective memory cell. The repair unit 143 may program the first anti-fuse when both the repair start signal RPST and the refresh exit signal RFED are activated. The configuration of anti-fuse, the programming of the anti-fuse, and the operation of verifying whether the anti-fuse is programmed are widely known to those skilled in the art, and thus detailed description will be omitted.

The repair unit 143 may generate the repair control signal RPCTR. A first one of the plurality of redundancy memory cells RC may be accessed in response to the repair control signal RPCTR when it is requested to access the first defective memory cell after the repair operation (e.g., the operation of programming the first anti-fuse) is completed. The first redundancy memory cell may be used for repairing the first defective memory cell.

In addition, the repair unit 143 may generate a repair exit signal RPED indicating that the repair operation is completed. For example, the repair unit 143 may activate the repair exit signal RPED when the repair operation is complete. Configuration of the repair unit 143 will be described in detail with reference to FIG. 4.

The command control unit 145 may block other commands except the repair command RPCMD based on the repair start signal RPST and may unblock the other commands except for the repair command RPCMD in response to the repair exit signal RPED.

Although FIG. 2 illustrates an example where the repair start signal generation unit 141 and the command control unit 145 are included in the repair control circuit 140, in some embodiments, the repair start signal generation unit 141 and the command control unit 145 may be included in a command decoder (not illustrated) that is included in the semiconductor memory device 100 of FIG. 1.

Figure 3:
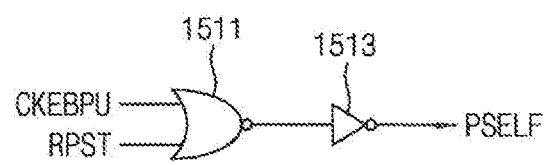
FIG. 3 is a diagram illustrating an example of a self-refresh detection unit included in the refresh control circuit in FIG. 2.

FIG. 3 is a diagram illustrating an example of a self-refresh detection unit included in the refresh control circuit in FIG. 2.

Referring to FIG. 3, the self-refresh detection unit 151 may include a NOR gate 1511 and an inverter 1513.

The NOR gate 1511 may perform a NOR operation on the repair start signal RPST and an internal clock enable signal CKEBPU. The internal clock enable signal CKEBPU may be generated in response to a clock enable signal (e.g., /CKE). For example, the clock enable signal may have a logic low level when the hidden self-refresh operation is performed, and the internal clock enable signal CKEBPU may be transitioned from a logic high level to the logic low level based on the clock enable signal.

The inverter 1513 may generate the self-refresh start signal PSELF by inverting an output signal of the NOR gate 1511.

Figure 4:
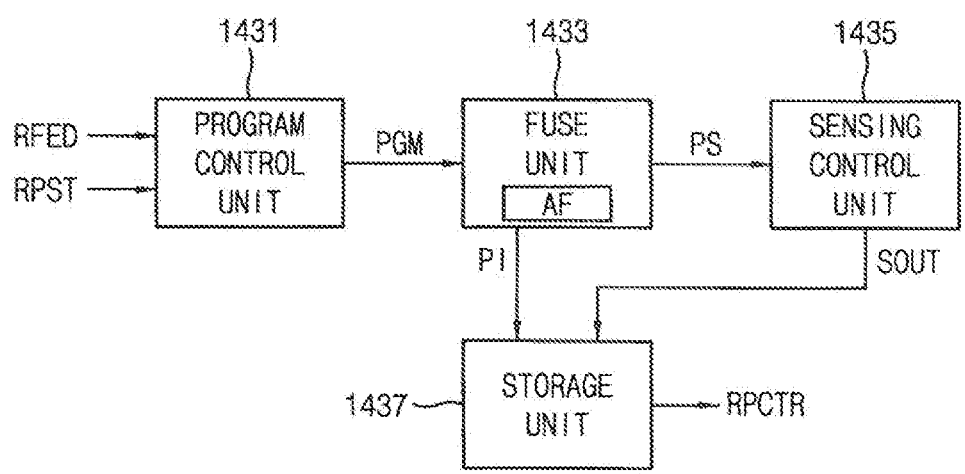
FIG. 4 is a diagram illustrating an example of a repair unit included in the repair control circuit in FIG. 2.

FIG. 4 is a diagram illustrating an example of a repair unit included in the repair control circuit in FIG. 2.

Referring to FIG. 4, the repair unit 143 may include a program control unit 1431, a fuse unit 1433, a sensing control unit 1435 and a storage unit 1437.

The program control unit 1431 may generate a program signal PGM in response to the repair start signal RPST and the refresh exit signal RFED. Although not illustrated in FIG. 4, the program control unit 1431 may further generate a row selection signal, an anti-fuse selection signal, a sensing enable signal, etc.

The fuse unit 1433 may include a plurality of anti-fuses AF and may program a first one of the anti-fuses AF in response to the program signal PGM. The programmed anti-fuse may correspond to the first defective memory cell. For example, the plurality of anti-fuses AF may be implemented with a fuse array where the plurality of anti-fuses AF are arranged in a matrix form. The first anti-fuse may be selected based on the row selection signal and the anti-fuse selection signal and may be programmed in response to the program signal PGM. The fuse unit 1433 may generate a program output signal PS in response to the sensing enable signal and may generate program information PI that indicates a programmed state or an unprogrammed state of each of the plurality of anti-fuses AF.

The sensing control unit 1435 may verify whether the first anti-fuse is programmed properly based on the program output signal PS and may generate a sensing output signal SOUT based on the verification result.

The storage unit 1437 may store repair information associated with the first defective memory cell based on the program information PI and the sensing output signal SOUT. For example, the repair information may include first fail cell information corresponding to the first defective memory cell and first redundancy cell information corresponding to the first redundancy memory cell. The first fail cell information may include a first fail address for the first defective memory cell, and the first redundancy cell information may include a first redundancy address for the first redundancy memory cell. The storage unit 1437 may generate the repair control signal RPCTR that is used for accessing the memory cell array 110 in FIG. 1 after the repair operation is completed.

Figure 5A:
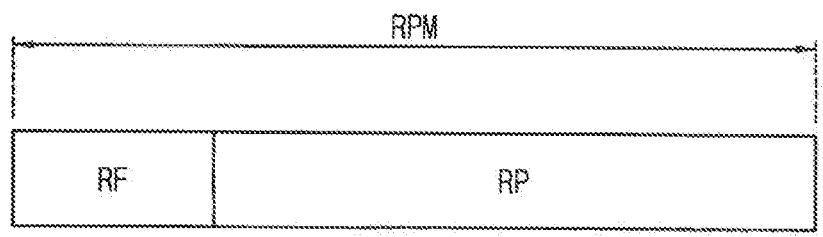
FIGS. 5A and 5B are diagrams for describing an operation of the semiconductor memory device of FIG. 1.
Figure 5B:
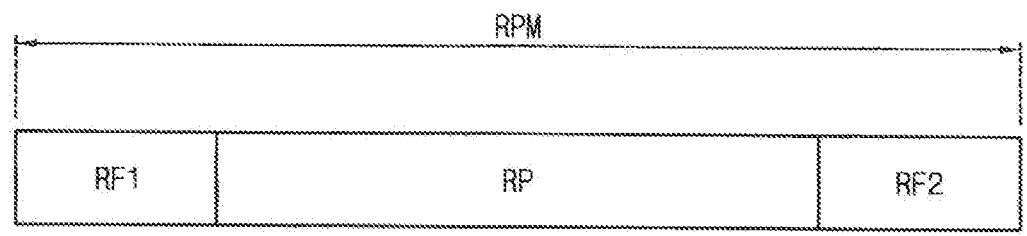

FIGS. 5A and 5B are diagrams for describing an operation of the semiconductor memory device of FIG. 1.

Referring to FIG. 5A, during a repair mode RPM according to some embodiments, the semiconductor memory device 100 of FIG. 1 may perform a refresh operation RF before the semiconductor memory device 100 of FIG. 1 starts to perform a repair operation RP. In other words, in the repair mode RPM of the semiconductor memory device 100 of FIG. 1, the refresh operation RF may be performed at first, and then the repair operation RP may be performed after the refresh operation RF is completed.

The operation of the semiconductor memory device 100 will be described with reference to FIGS. 1, 2 and 5A. When the repair command RPCMD is received from the outside of the semiconductor memory device 100, the self-refresh start signal PSELF may be activated. The semiconductor memory device 100 may perform the refresh operation RF (e.g., the hidden self-refresh operation) on the normal memory cells in response to the activated self-refresh start signal PSELF. When the refresh operation RF is completed, the refresh exit signal RFED may be activated. After the refresh operation RF is completed, the semiconductor memory device 100 may perform the repair operation RP (e.g., the PPR operation) in response to the activated refresh exit signal RFED.

Referring to FIG. 5B, during a repair mode RPM according to other embodiments, the semiconductor memory device 100 of FIG. 1 may perform a part of a refresh operation before the semiconductor memory device 100 of FIG. 1 starts to perform a repair operation RP and may perform the rest of the refresh operation after the repair operation RP is completed. In other words, the refresh operation may include a first refresh operation RF1 for some of the normal (non-defective) memory cells and a second refresh operation RF2 for the others of the normal memory cells after the repair operation is completed. In the repair mode RPM of the semiconductor memory device 100 of FIG. 1, the first refresh operation RF1 may be performed at first, the repair operation RP may be performed after the first refresh operation RF1 is completed, and then the second refresh operation RF2 may be performed after the repair operation RP is completed.

The operation of the semiconductor memory device 100 will be described with reference to FIGS. 1, 2 and 5B. When the repair command RPCMD is received from the outside of the semiconductor memory device 100, the self-refresh start signal PSELF may be activated. The semiconductor memory device 100 may perform the first refresh operation RF1 (e.g., the hidden self-refresh operation) on some of the normal memory cells in response to the activated self-refresh start signal PSELF. When the first refresh operation RF1 is completed, the refresh exit signal RFED may be activated. After the first refresh operation RF1 is completed, the semiconductor memory device 100 may perform the repair operation RP (e.g., the PPR operation) in response to the activated refresh exit signal RFED. When the repair operation RP is completed, the refresh exit signal RFED may be deactivated. After the repair operation RP is completed, the semiconductor memory device 100 may perform the second refresh operation RF2 (e.g., the hidden self-refresh operation) on the others of the normal memory cells in response to the activated self-refresh start signal PSELF.

Figure 6:
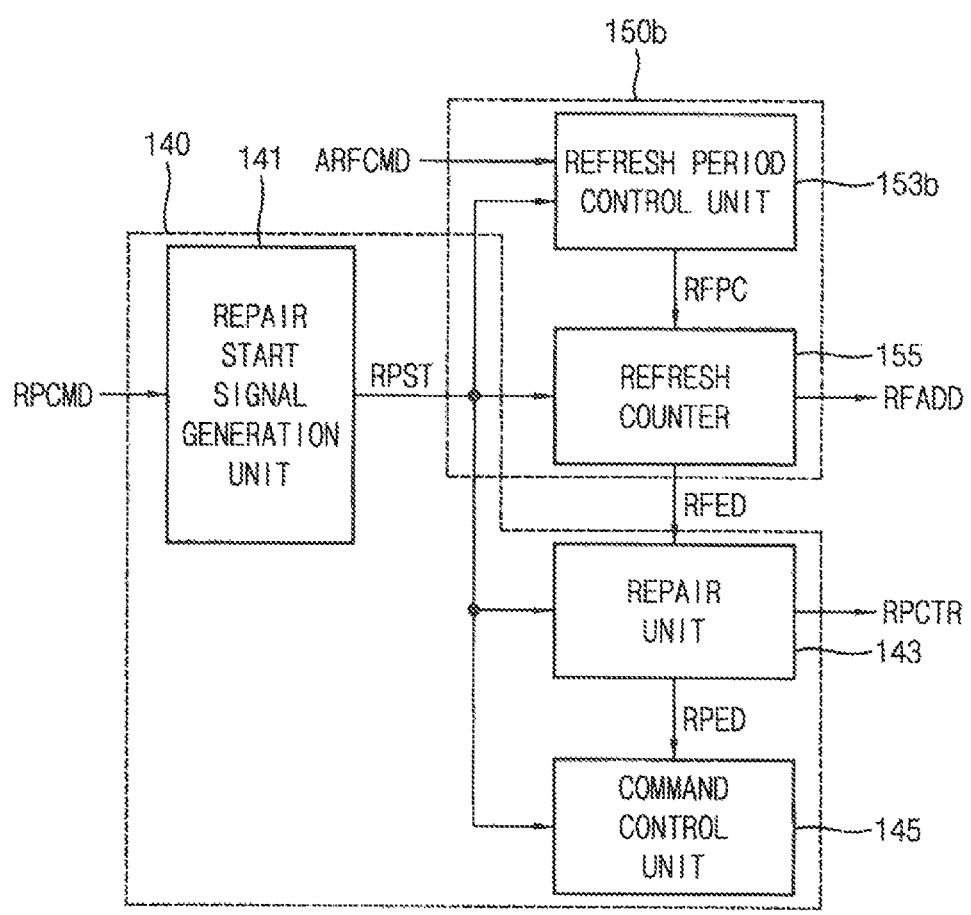
FIG. 6 is a block diagram illustrating another example of the repair control circuit and another example of the refresh control circuit included in the semiconductor memory device of FIG. 1.

FIG. 6 is a block diagram illustrating another example of a repair control circuit and another example of a refresh control circuit that may be included in the semiconductor memory device of FIG. 1.

As described above with reference to FIG. 1, the refresh operation that is performed during the repair mode may be the hidden refresh operation. In addition, in the embodiments of FIG. 6, the refresh operation may be the auto-refresh operation that is performed in response to an auto-refresh command ARFCMD. In other words, in the embodiments of FIG. 6, the refresh operation may be the hidden auto-refresh operation that is performed in response to the repair command RPCMD and the auto-refresh command ARFCMD that are provided from the outside of the semiconductor memory device 100 of FIG. 1.

Referring to FIG. 6, a refresh control circuit 150b may include a refresh period control unit 153b and a refresh counter 155.

The refresh period control unit 153b may generate a refresh period control signal RFPC in response to the auto-refresh command ARFCMD and a repair start signal RPST generated in response to the repair command RPCMD. For example, the refresh period control unit 153b may generate the refresh period control signal RFPC when the repair start signal RPST is activated and when the auto-refresh command ARFCMD is provided from the outside of the semiconductor memory device 100 of FIG. 1 (e.g., from an external memory controller and/or an external processor or host). An auto-refresh period (e.g., a hidden auto-refresh period) that is required to perform the auto-refresh operation (e.g., the hidden auto-refresh operation) may be reduced based on the refresh period control signal RFPC. In other words, a hidden auto-refresh period that is required to perform the hidden auto-refresh operation may be shorter than a conventional auto-refresh period that is required to perform a conventional auto-refresh operation.

The refresh counter 155 may generate a refresh address RFADD in response to the repair start signal RPST and the refresh period control signal RFPC. The auto-refresh operation (e.g., the hidden auto-refresh operation) may be performed on the normal (non-defective) memory cells in response to the refresh address RFADD and the reduced auto-refresh period (e.g., the hidden auto-refresh period). In addition, the refresh counter 155 may generate a refresh exit signal RFED indicating that the auto-refresh operation (e.g., the hidden auto-refresh operation) is completed.

The repair control circuit 140 may include a repair start signal generation unit 141, a repair unit 143 and a command control unit 145.

The repair start signal generation unit 141 may generate the repair start signal RPST in response to the repair command RPCMD. The repair unit 143 may perform the repair operation on the first defective memory cell in response to the repair start signal RPST and the refresh exit signal RFED and may generate a repair exit signal RPED indicating that the repair operation is completed. The command control unit 145 may block commands other than the repair command RPCMD and the auto-refresh command ARFCMD after receipt of the repair start signal RPST and may unblock the other commands in response to the repair exit signal RPED.

In some embodiments, as described above with reference to FIG. 5A, the semiconductor memory device 100 of FIG. 1 may perform a refresh operation (e.g., the hidden auto-refresh operation) before the semiconductor memory device 100 of FIG. 1 starts to perform the repair operation (e.g., the PPR operation). In other some embodiments, as described above with reference to FIG. 5B, the semiconductor memory device 100 of FIG. 1 may perform a part of a refresh operation (e.g., the hidden auto-refresh operation) before the semiconductor memory device 100 of FIG. 1 starts to perform the repair operation (e.g., the PPR operation) and may perform the rest of the refresh operation after the repair operation is completed.

Figure 7:
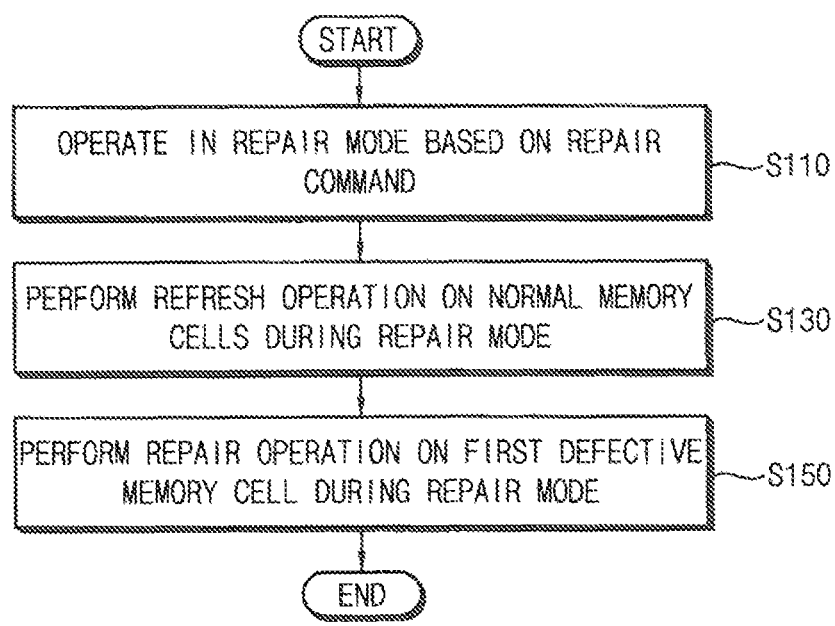
FIG. 7 is a flow chart illustrating a method of operating the semiconductor memory device according to some embodiments.

FIG. 7 is a flow chart illustrating methods of operating a semiconductor memory device according to some embodiments.

Referring to FIGS. 1 and 7, in a method of operating the semiconductor memory device according to some embodiments, the semiconductor memory device 100 operates in the repair mode in response to the repair command RPCMD (step S110). For example, the repair command RPCMD may be provided from the outside of the semiconductor memory device 100 (e.g., from the external memory controller and/or the external processor or host).

During the repair mode, the semiconductor memory device 100 performs a refresh operation on the normal memory cells MCother than the first defective memory cell (step S130). For example, the refresh operation may be a hidden refresh operation, and more particularly a hidden self-refresh operation or a hidden auto-refresh operation.

During the repair mode, the semiconductor memory device 100 performs the repair operation on the first defective memory cell MC (step S150). For example, the repair operation may be a post package repair (PPR) operation and may be performed by programming (e.g., rupturing) the at least one anti-fuse among a plurality of anti-fuses.

In some embodiments, the PPR operation may be performed on the first defective memory cell during the repair mode, and the hidden refresh operation may be performed on the memory cells other than the first defective memory cell during the repair mode. Accordingly, the semiconductor memory device 100 may have a relatively improved data retention performance.

Figure 8:
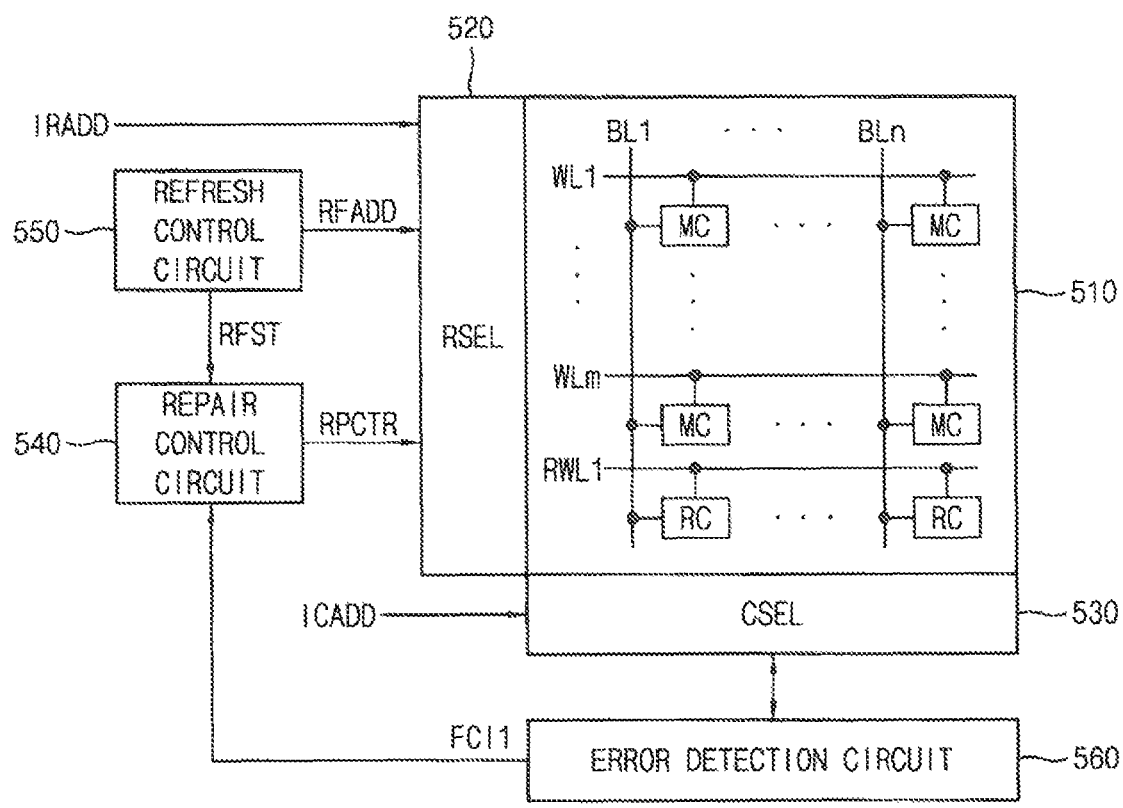
FIG. 8 is a block diagram illustrating a semiconductor memory device according to some embodiments.

FIG. 8 is a block diagram illustrating a semiconductor memory device according to further embodiments.

Referring to FIG. 8, a semiconductor memory device 500 includes a memory cell array 510, an error detection circuit 560 and a repair control circuit 540. The semiconductor memory device 500 may further include a row selection circuit 520, a column selection circuit 530 and a refresh control circuit 550.

The memory cell array 510 includes a plurality of memory cells MC and a plurality of redundancy memory cells RC. The plurality of memory cells MC may be connected to a plurality of bitlines BL1, . . . , BLn and a plurality of wordlines WL1, . . . , WLm, respectively. The plurality of redundancy memory cells RC may be connected to the plurality of bitlines BL1, . . . , BLn and a redundancy wordline RWL1, respectively.

The error detection circuit 560 detects a first defective memory cell among the plurality of memory cells MC. For example, the error detection circuit 560 may store first fail cell information FCI1 corresponding to the first defective memory cell. The first fail cell information FCI1 may include a first fail address and/or a first fail flag bit for the first defective memory cell. In some embodiments, the error detection circuit 560 may be an ECC circuit or a BIST circuit.

The repair control circuit 540 performs a repair operation on the first defective memory cell based on the first fail cell information FCI1 during a predetermined first operation mode of the semiconductor memory device 500. The repair control circuit 540 may generate a repair control signal RPCTR that is used for accessing the memory cell array 510 after the repair operation is completed.

In the embodiments of FIG. 8, the repair operation may be the PPR operation that is performed after the semiconductor memory device 500 is packaged. In addition, in the embodiment of FIG. 8, the repair operation may be a hidden repair operation that is performed without any external command being provided from outside of the semiconductor memory device 500.

The repair control circuit 540 may include a plurality of anti-fuses. In some embodiments, the repair operation may indicate a hard repair operation (e.g., a hidden hard repair operation) that is performed to store repair information associated with the first defective memory cell by programming a first anti-fuse among the plurality of anti-fuses. In other some embodiments, the repair operation may indicate a soft repair operation (e.g., a hidden soft repair operation) that is performed to store the repair information associated with the first defective memory cell without programming the first anti-fuse among the plurality of anti-fuses.

The refresh control circuit 550 may perform a refresh operation on the plurality of memory cells MC and may generate a refresh start signal RFST and a refresh address RFADD. The refresh start signal RFST may indicate that the semiconductor memory device 500 starts to perform the refresh operation, and the refresh operation may be performed based on the refresh address RFADD.

In the embodiments of FIG. 8, the refresh operation may be a self-refresh operation that is performed without any external command provided from the outside of the semiconductor memory device 500 or may be an auto-refresh operation that is performed in response to an auto-refresh command provided from the outside of the semiconductor memory device 500. In the self-refresh operation, the refresh start signal RFST may correspond to a self-refresh start signal. In the auto-refresh operation, the refresh start signal RFST may correspond to the auto-refresh command.

In some embodiments, the first operation mode may be a refresh mode during which the refresh operation is performed. For example, the first operation mode may be a self-refresh mode for the self-refresh operation or an auto-refresh mode for the auto-refresh operation. In this case, the repair control circuit 540 may perform the repair operation based on the refresh start signal RFST.

Although FIG. 8 illustrates an example where the first operation mode is the refresh mode, the first operation mode may not be limited to the refresh mode and may be any operation mode for an operation of the semiconductor memory device 500.

The row selection circuit 520 may select one of the wordlines WL1, . . . , WLm and the redundancy wordline RWL1 based on an input row address IRADD, the refresh address RFADD or the repair control signal RPCTR. The column selection circuit 530 may select one of the bitlines BL1, . . . , BLn based on an input column address ICADD.

To repair defective memory cells that are detected after the memory cell has been packaged, a semiconductor memory device 500 according to some embodiments may detect the first defective memory cell and may perform a hidden repair operation on the first defective memory cell during a first operation mode (e.g., the refresh mode), as opposed to during a conventional repair mode. Accordingly, the semiconductor memory device 500 may have a relatively improved data reliability performance in a data write and/or read operation.

Figure 9:
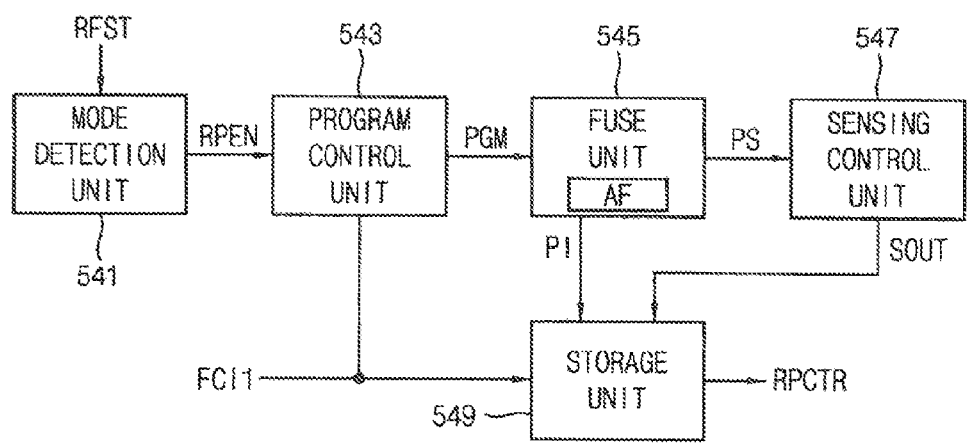
FIG. 9 is a block diagram illustrating an example of a repair control circuit included in the semiconductor memory device of FIG. 8.

FIG. 9 is a block diagram illustrating a repair control circuit according to some embodiments that may be included in the semiconductor memory device of FIG. 8.

As described above with reference to FIG. 8, the repair operation that is performed during the first operation mode may be a hidden repair operation. In addition, in an example embodiment of FIG. 9, the repair operation may be a hard repair operation (e.g., the hidden hard repair operation) that is performed to store the repair information associated with the first defective memory cell by programming the first anti-fuse.

Referring to FIG. 9, a repair control circuit 540a may include a mode detection unit 541, a program control unit 543, a fuse unit 545, a sensing control unit 547 and a storage unit 549.

The mode detection unit 541 may detect the first operation mode and responsively generate a repair enable signal RPEN. For example, the mode detection unit 541 may detect the refresh mode in response to the refresh start signal RFST and may activate the repair enable signal RPEN when the refresh start signal RFST is activated.

The program control unit 543 may generate a program signal PGM in response to the repair enable signal RPEN and the first fail cell information FCI1 corresponding to the first defective memory cell. Although not illustrated in FIG. 9, the program control unit 543 may further generate a row selection signal, an anti-fuse selection signal, a sensing enable signal, etc.

The fuse unit 545 may include a plurality of anti-fuses AF and may program a first one of the anti-fuses AF in response to the program signal PGM. The first anti-fuse may correspond to the first defective memory cell. For example, the plurality of anti-fuses AF may be implemented with a fuse array where the plurality of anti-fuses AF are arranged in a matrix form. The first anti-fuse may be selected in response to the row selection signal and the anti-fuse selection signal and may be programmed in response to the program signal PGM. The fuse unit 545 may generate a program output signal PS based on the sensing enable signal and may generate program information PI that indicates a programmed state or an unprogrammed state of each of the plurality of anti-fuses AF.

The sensing control unit 547 may verify whether the first anti-fuse is programmed properly based on the program output signal PS and may generate a sensing output signal SOUT based on the verification result.

The storage unit 549 may store the repair information associated with the first defective memory cell based on states of the plurality of anti-fuses AF. For example, the storage unit 549 may store the repair information based on the first fail cell information FCI1, the program information PI and the sensing output signal SOUT. The repair information may include the first fail cell information FCI1 and first redundancy cell information corresponding to the first redundancy memory cell. The first fail cell information FCI1 may include a first fail address for the first defective memory cell, and the first redundancy cell information may include a first redundancy address for the first redundancy memory cell. The storage unit 549 may generate the repair control signal RPCTR that is used for accessing the memory cell array 510 in FIG. 8 after the repair operation is completed.

After the repair operation (e.g., the hidden hard repair operation) is completed, it may be requested to access one of the plurality of memory cells MC (e.g., a request for writing data into a target memory cell or a request for read data from the target memory cell). For example, when it is requested to access a first normal (non-defective) memory cell, the repair control circuit 540a may compare the repair information stored in the storage unit 549 with a first normal address for the first normal memory cell. Since the first normal address is not stored in the storage unit 549, the first normal memory cell may be accessed based on, not the repair control signal RPCTR, but the first normal address. For another example, when it is requested to access the first defective memory cell, the repair control circuit 540a may compare the repair information stored in the storage unit 549 with the first fail address for the first defective memory cell. Since the first fail address is stored in the storage unit 549, the repair control signal RPCTR may include the first redundancy address corresponding to the first fail address, and thus the first redundancy memory cell may be accessed, instead of the first defective memory cell, in response to the repair control signal RPCTR having the first redundancy address.

Figure 10:
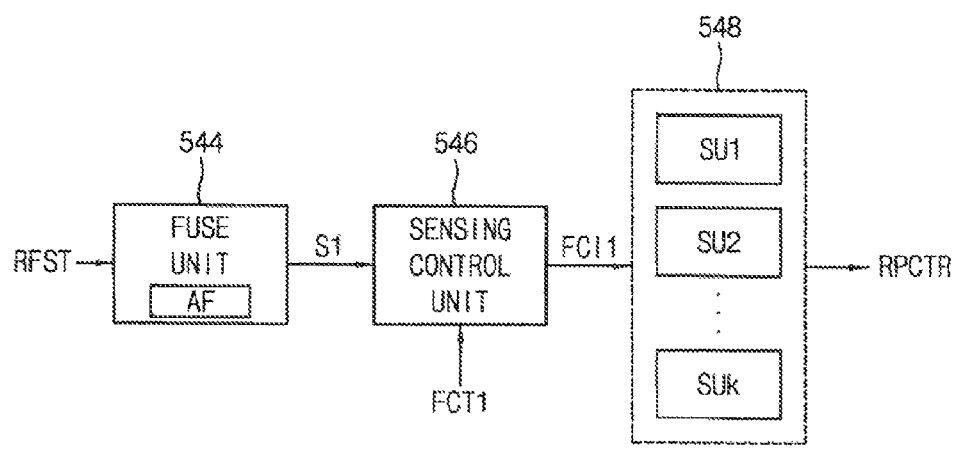
FIG. 10 is a block diagram illustrating another example of the repair control circuit included in the semiconductor memory device of FIG. 8.

FIG. 10 is a block diagram illustrating another example of a repair control circuit that may be included in the semiconductor memory device of FIG. 8.

As described above with reference to FIG. 8, the repair operation that is performed during the first operation mode may be a hidden repair operation. In addition, in the embodiments of FIG. 9, the repair operation may be a soft repair operation (e.g., a hidden soft repair operation) that is performed to store the repair information associated with the first defective memory cell without programming the first anti-fuse.

Referring to FIG. 10, a repair control circuit 540b may include a fuse unit 544, a sensing control unit 546 and a storage block 548. The storage block 548 may include a plurality of storage units SU1, SU2, . . . , SUk.

The fuse unit 544 may include a plurality of anti-fuses AF and may generate a first signal S1 based on the refresh start signal RFST. The first signal S1 may include information associated with an usability of one of the plurality of storage units SU1, . . . , SUk. For example, the first signal S1 may indicate whether the first storage unit SU1 among the plurality of storage units SU1, . . . , SUk is usable.

The sensing control unit 546 may provide the first fail cell information FCI1 corresponding to the first defective memory cell to the first storage unit SU1 based on the first signal S1 when it is determined that the first storage unit SU1 is usable.

The first storage unit SU1 may store the first fail cell information FCI1. For example, the first fail cell information FCI1 may include a first fail address for the first defective memory cell. The storage block 548 may generate the repair control signal RPCTR that is used for accessing the memory cell array 510 in FIG. 8 after the repair operation is completed.

After the repair operation (e.g., the hidden soft repair operation) is completed, it may be requested to access one of the plurality of memory cells MC (e.g., a request for writing data into a target memory cell or a request for read data from the target memory cell). For example, when it is requested to access a first normal memory cell, the repair control circuit 540b may compare the repair information stored in the storage units SU1, . . . , SUk with a first normal address for the first normal memory cell. Since the first normal address is not stored in the storage units SU1, . . . , SUk, the repair control signal RPCTR may have a first logic level corresponding to a normal access, and thus the first normal memory cell may be accessed based on, not the repair control signal RPCTR, but the first normal address. For another example, when it is requested to access the first defective memory cell, the repair control circuit 540b may compare the repair information stored in the storage units SU1, . . . , SUk with the first fail address for the first defective memory cell. Since the first fail address is stored in the first storage unit SU1, the repair control signal RPCTR may have a second logic level corresponding to a repair access, and thus the first redundancy memory cell may be accessed, instead of the first defective memory cell, based on the repair control signal RPCTR and the first redundancy address.

Figure 11:
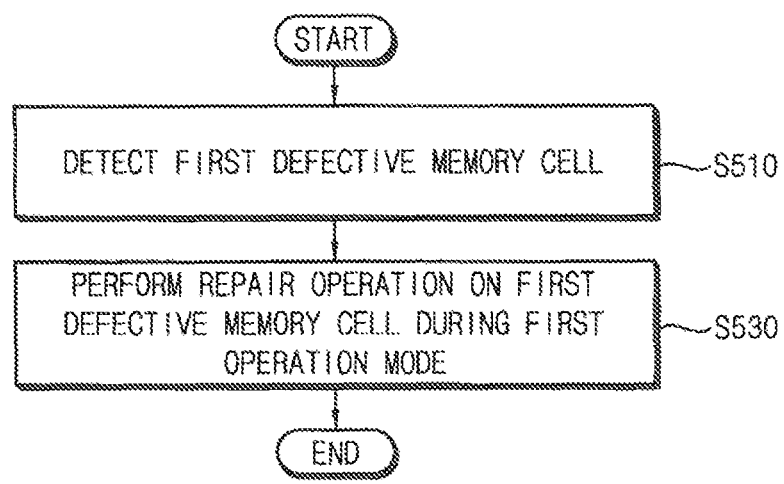
FIG. 11 is a flow chart illustrating a method of operating the semiconductor memory device according to some embodiments.

FIG. 11 is a flow chart illustrating methods of operating the semiconductor memory device according to some embodiments.

Referring to FIGS. 8 and 11, in a method of operating the semiconductor memory device according to some embodiments, the semiconductor memory device 500 detects a first defective memory cell among the plurality of memory cells MC (step S510). For example, the semiconductor memory device 500 may include the error detection circuit 560 that detects the first defective memory cell. The error detection circuit 560 may be the ECC circuit or the BIST circuit.

During the first operation mode, the semiconductor memory device 500 performs a repair operation on the first defective memory cell (step S530). For example, the first operation mode may be the refresh mode, e.g., the self-refresh mode for the self-refresh operation or the auto-refresh mode for the auto-refresh operation. The repair operation may be a hidden repair operation, e.g., the hidden hard repair operation or the hidden soft repair operation.

In the method of operating the semiconductor memory device 500 according to some embodiments, the hidden repair operation may be performed on the first defective memory cell during the first operation mode and not during a conventional repair mode. Accordingly, the semiconductor memory device 500 may have a relatively improved data reliability performance.

Figure 12:
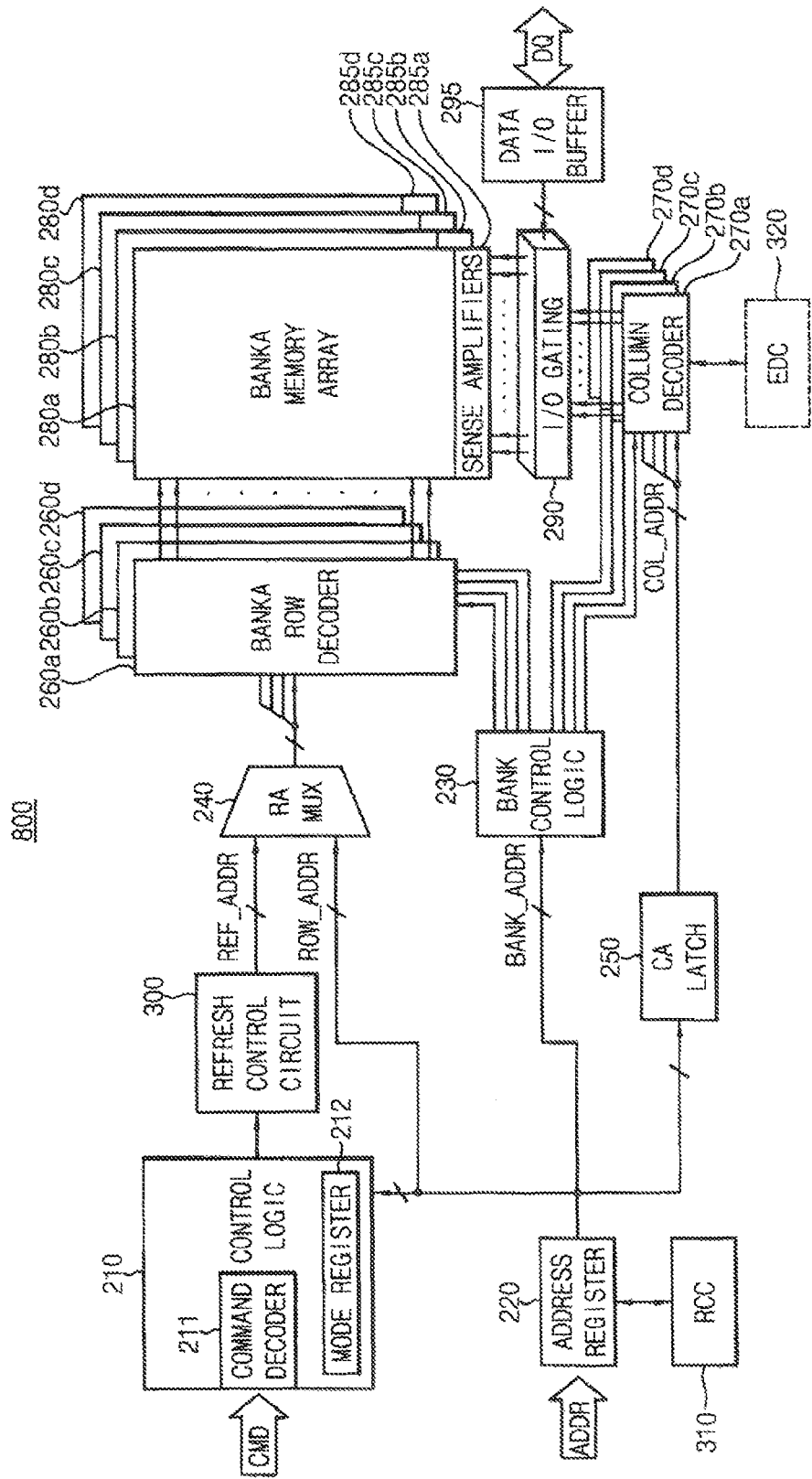
FIG. 12 is a block diagram illustrating a semiconductor memory device according to some embodiments.

FIG. 12 is a block diagram illustrating a semiconductor memory device according to some embodiments.

Referring to FIG. 12, a semiconductor memory device 800 includes a control logic 210, an address register 220, a bank control logic 230, a row address multiplexer 240, a column address latch 250, a row decoder, a column decoder, a memory cell array, a sense amplifier unit, an input/output (I/O) gating circuit 290, a data I/O buffer 295, a refresh control circuit 300, a repair control circuit 310 and an error detection circuit 320.

The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d connected to the first through fourth bank arrays 280a, 280b, 280c and 280d, respectively. The column decoder may include a plurality of bank column decoders, e.g., first through fourth bank column decoders 270a, 270b, 270c and 270d connected to the first through fourth bank arrays 280a, 280b, 280c and 280d, respectively. The sense amplifier unit may include a plurality of bank sense amplifiers, e.g., first through fourth bank sense amplifiers 285a, 285b, 285c and 285d connected to the first through fourth bank arrays 280a, 280b, 280c and 280d, respectively. The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks. Although FIG. 12 illustrates the semiconductor memory device 800 including four banks, in other some embodiments, the semiconductor memory device 800 may include any number of banks.

In some embodiments, the semiconductor memory device 800 may be a dynamic random access memory (DRAM), such as a double data rate (DDR) synchronous DRAM (SDRAM), a low power DDR (LPDDR) SDRAM, a graphics double data rate (GDDR) SDRAM, a Rambus DRAM (RDRAM), etc., or may be other types of semiconductor memory devices that require a repair operation and a refresh operation.

The address register 220 may receive an address ADDR including a bank address BANK_ADDR, a row address ROW_ADDR and a column address COL_ADDR from a memory controller (not illustrated). The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220, and may receive a refresh address REF_ADDR from the refresh control circuit 300. The row address multiplexer 240 may selectively output the row address ROW_ADDR or the refresh address REF_ADDR. A row address output from the row address multiplexer 240 may be applied to the first through fourth bank row decoders 260a, 260b, 260c and 260d.

The activated one of the first through fourth bank row decoders 260a, 260b, 260c and 260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or generated column address to the first through fourth bank column decoders 270a, 270b, 270c and 270d.

The activated one of the first through fourth bank column decoders 270a, 270b, 270c and 270d may decode the column address COL_ADDR output from the column address latch 250, and may control the I/O gating circuit 290 to output data corresponding to the column address COL_ADDR.

The I/O gating circuit 290 may include a circuitry for gating I/O data. The I/O gating circuit 290 may further include an input data mask logic, read data latches for storing data output from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array, and may be stored in the read data latches. The data DQ stored in the read data latches may be provided to the memory controller via the data I/O buffer 295. Data DQ to be written to one bank array of the first through fourth bank arrays 280a, 280b, 280c and 280d may be provide from the memory controller to the data I/O buffer 295. The data DQ provided to the data I/O buffer 295 may be written to the one array bank via the write drivers.

The control logic 210 may control an operation of the semiconductor memory device 800. For example, the control logic 210 may generate control signals for the semiconductor memory device 800 to perform a write operation or a read operation. The control logic 210 may include a command decoder 211 that decodes a command CMD received from the memory controller and a mode register 212 that sets an operation mode of the semiconductor memory device 800. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The command decoder 211 may further receive a clock signal (e.g., CLK) and a clock enable signal (e.g., /CKE) for operating the semiconductor memory device 800 in a synchronous manner.

The refresh control circuit 300 may generate the refresh address REF_ADDR to be provided to the row address multiplexer 240 based on the control of the control logic 210. The refresh operation may be performed on a plurality of memory cells included in the memory cell array based on the refresh address REF_ADDR. The error detection circuit 320 may detect a first defective memory cell among the plurality of memory cells. The repair control circuit 310 may perform the repair operation on the first defective memory cell.

The semiconductor memory device 800 according to some embodiments may perform the PPR operation on the first defective memory cell during the repair mode and may perform the hidden refresh operation on normal memory cells during the repair mode, thereby having a relatively improved data retention performance. In addition, the semiconductor memory device 800 according to some embodiments may perform the hidden repair operation on the first defective memory cell during, not the conventional repair mode, but the first operation mode (e.g., the refresh mode), thereby having a relatively improved data reliability performance.

Figure 13:
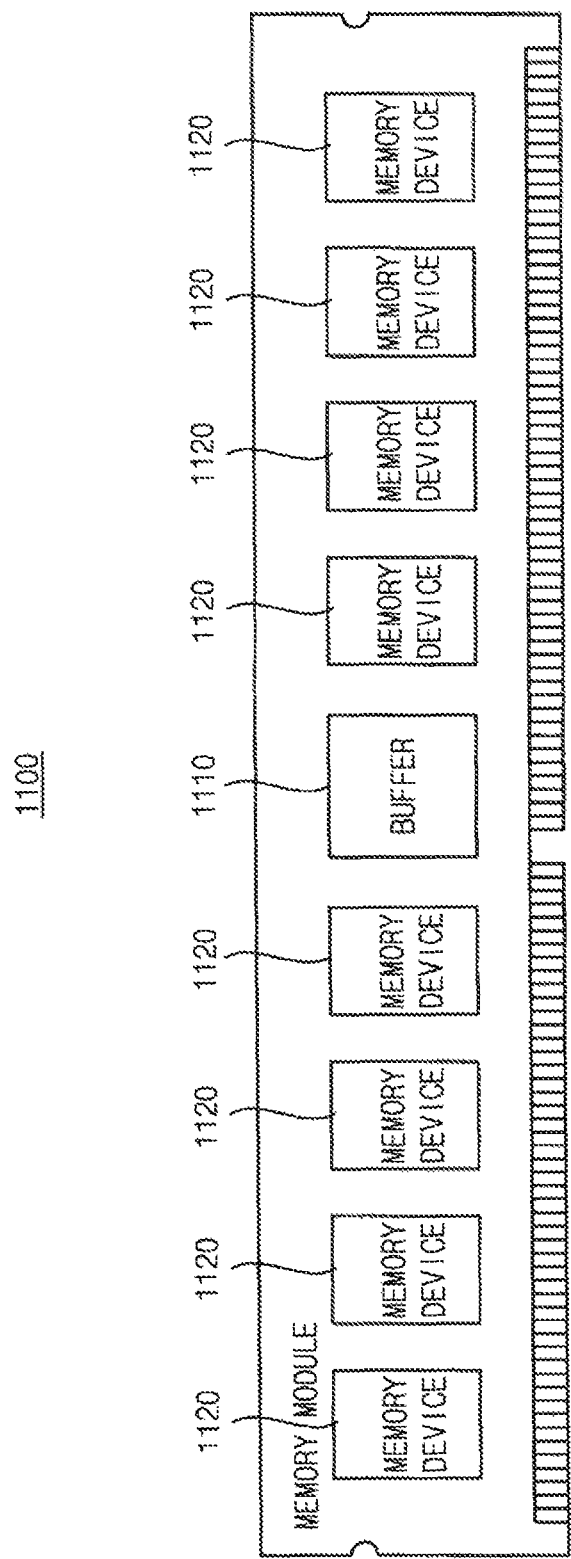
FIG. 13 is a block diagram illustrating a memory module according to some embodiments.

FIG. 13 is a block diagram illustrating a memory module according to some embodiments.

Referring to FIG. 13, a memory module 1100 may include a plurality of semiconductor memory devices 1120. According to some embodiments, the memory module 1100 may be an unbuffered dual in-line memory module (UDIMM), a registered dual in-line memory module (RDIMM), a fully buffered dual in-line memory module (FBDIMM), a load reduced dual in-line memory module (LRDIMM), etc.

The memory module 1100 may further include a buffer 1110. The buffer 1110 may receive a command signal, an address signal and/or data from a memory controller (not illustrated) through a plurality of transmission lines, and may provide the command signal, the address signal and/or the data to the plurality of semiconductor memory devices 1120 by buffering the command signal, the address signal and/or the data.

In some embodiments, data transmission lines between the buffer 1110 and the semiconductor memory devices 1120 may be connected in a point-to-point topology. In some embodiments, command/address transmission lines between the buffer 1110 and the semiconductor memory devices 1120 may be connected in a multi-drop topology, a daisy-chain topology, a fly-by daisy-chain topology, or the like. Since the buffer 1110 buffers all of the command signal, the address signal and the data, the memory controller may interface with the memory module 1100 by driving only a load of the buffer 1110. Accordingly, the memory module 1100 may include more semiconductor memory devices 1120 and/or more memory ranks, and a memory system may include more memory modules.

Each of the semiconductor memory devices 1120 may be one of the semiconductor memory devices 100 of FIG. 1, the semiconductor memory devices 500 of FIG. 8 and the semiconductor memory devices 800 of FIG. 12. Each of the semiconductor memory devices 1120 may perform a post packaging repair (PPR) operation on a first defective memory cell during a repair mode and may perform a hidden refresh operation on normal (non-defective) memory cells during the repair mode, thereby resulting in the device having a relatively improved data retention performance. In addition, each of the semiconductor memory devices 1120 may perform the hidden repair operation on the first defective memory cell during a first operation mode (e.g., the refresh mode) rather than during a conventional repair mode, thereby resulting in the device having a relatively improved data reliability performance.

Although FIGS. 1, 8 and 12 illustrate examples where the repair control circuit, the refresh control circuit and/or the error detection circuit are included in the semiconductor memory devices, in other some embodiments, at least a part of the repair control circuit, the refresh control circuit and/or the error detection circuit may be included in the buffer 1110.

Figure 14:
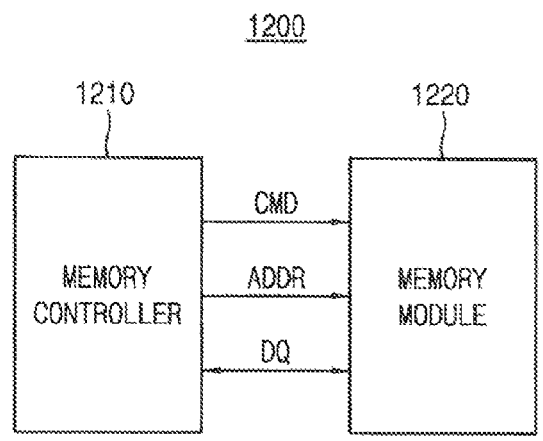
FIG. 14 is a block diagram illustrating a memory system according to some embodiments.

FIG. 14 is a block diagram illustrating a memory system according to some embodiments.

Referring to FIG. 14, a memory system 1200 may include a memory controller 1210 and a memory module 1220.

The memory controller 1210 may transmit a command signal CMD to the memory module 1220 via a command transmission line, may transmit an address signal ADDR to the memory module 1220 via an address transmission line, and may exchange data DQ with the memory module 1220 via a data transmission line. The memory controller 1210 may input data to the memory module 1220 or may receive data output from the memory module 1220 based on a request from a host (not illustrated).

The memory module 1220 may be the memory module 1100 of FIG. 13 and may include a plurality of semiconductor memory device. Each of the plurality of semiconductor memory device may perform the PPR operation on a first defective memory cell during the repair mode and may perform the hidden refresh operation on normal memory cells during the repair mode, thereby having a relatively improved data retention performance. In addition, each of the plurality of semiconductor memory devices may perform the hidden repair operation on the first defective memory cell during, not the conventional repair mode, but the first operation mode (e.g., the refresh mode), thereby having a relatively improved data reliability performance.

Although FIGS. 1, 8 and 12 illustrate examples where the repair control circuit, the refresh control circuit and/or the error detection circuit are included in the semiconductor memory devices, in other some embodiments, at least a part of the repair control circuit, the refresh control circuit and/or the error detection circuit may be included in the memory controller 1210.

Figure 15:
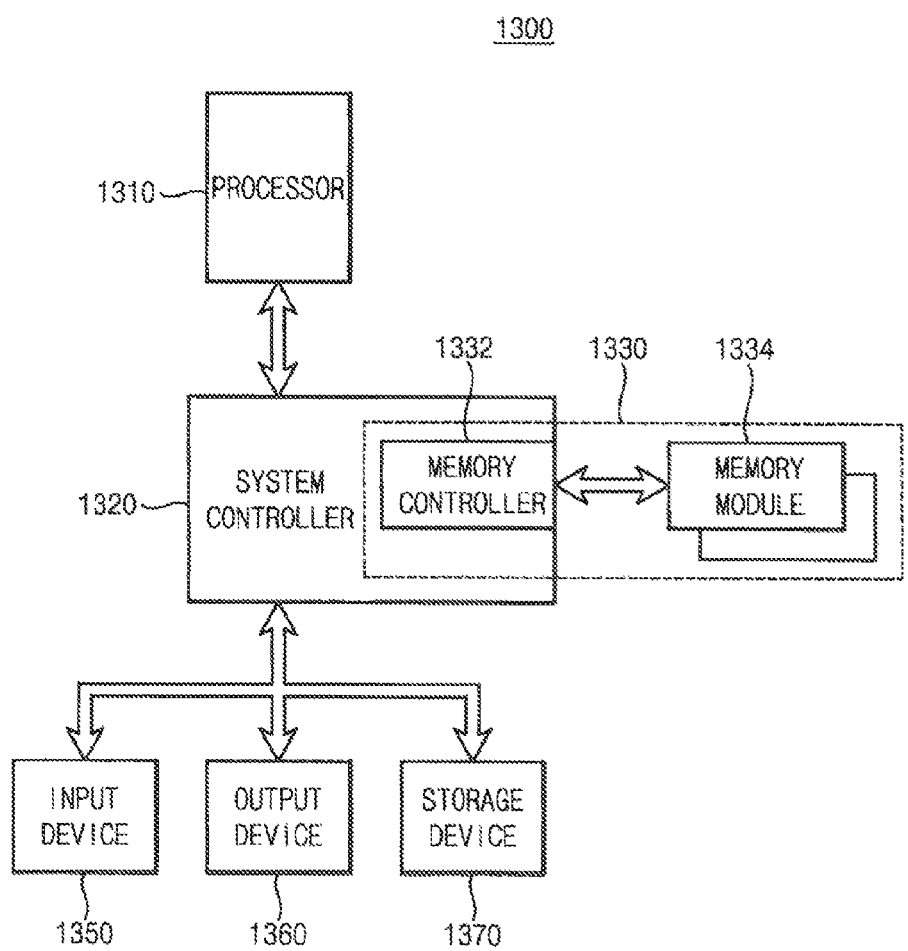
FIG. 15 is a block diagram illustrating a computing system according to some embodiments.

FIG. 15 is a block diagram illustrating a computing system according to some embodiments.

Referring to FIG. 15, a computing system 1300 may include a processor 1310, a system controller 1320 and a memory system 1330. The computing system 1300 may further include an input device 1350, an output device 1360 and a storage device 1370.

The memory system 1330 may include a plurality of memory modules 1334, and a memory controller 1332 for controlling the memory modules 1334. The memory modules 1334 may include a plurality of semiconductor memory devices. The memory controller 1332 may be included in the system controller 1320. Each of the memory modules 1334 may be the memory module 1100 of FIG. 13 and may include a plurality of semiconductor memory device. Each of the plurality of semiconductor memory device may perform the PPR operation on a first defective memory cell during the repair mode and may perform the hidden refresh operation on normal memory cells during the repair mode, thereby having a relatively improved data retention performance. In addition, each of the plurality of semiconductor memory devices may perform the hidden repair operation on the first defective memory cell during, not the conventional repair mode, but the first operation mode (e.g., the refresh mode), thereby having a relatively improved data reliability performance.

The processor 1310 may perform various computing functions, such as executing specific software for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

The above described embodiments may be used in a semiconductor memory device or system including the semiconductor memory device, such as a mobile phone, a smart phone, a personal digital assistants (PDA), a portable multimedia player (PMP), a digital camera, a digital television, a set-top box, a music player, a portable game console, a navigation device, a personal computer (PC), a server computer, a workstation, a tablet computer, a laptop computer, a smart card, a printer, etc.

The foregoing is illustrative of some embodiments and is not to be construed as limiting thereof. Although a few some embodiments have been described, those skilled in the art will readily appreciate that many modifications are possible in the some embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various some embodiments and is not to be construed as limited to the specific some embodiments disclosed, and that modifications to the disclosed some embodiments, as well as other some embodiments, are intended to be included within the scope of the appended claims.

What is claimed is:

1. A method of repairing a semiconductor memory device including a plurality of banks, the method comprising:
   entering into a repair mode;
   receiving, during the repair mode, a repair command and an address indicating a second memory cells in a second bank which includes at least one defective memory cell;
   performing a repair operation to replace the defective memory cell with a redundancy memory cell;
   receiving an auto-refresh command during the repair mode for refreshing a first memory cells in a first bank;
   performing an auto-refresh operation on the first memory cells in response to the auto-refresh command; and
   exiting the repair mode,
   wherein the repair operation is a post package repair (PPR) operation that is performed after the semiconductor memory device is packaged.

2. The method of claim 1, wherein the auto-refresh command during the repair operation is received with a first refresh period whereas a normal auto-refresh command is received with a second refresh period, wherein the first refresh period is shorter than the second refresh period.

3. The method of claim 2, wherein a first refresh window during the repair mode is shorter than a second refresh window during normal refresh operation.

4. The method of claim 1, wherein all banks in the semiconductor memory device excepting the second bank are refreshed during the repair mode.

5. The method of claim 1, wherein the auto-refresh command performs a hidden auto-refresh operation, the hidden auto-refresh operation performing at least a portion of the auto-refresh operation simultaneously with the repair operation.

6. The method of claim 1, wherein the semiconductor memory device performs at least a portion of the auto-refresh operation after the semiconductor memory device completes the repair operation.

7. The method of claim 1, wherein the repair operation is performed by programming a first anti-fuse set among a plurality of anti-fuse sets so that a first redundancy memory cell of a plurality of redundancy memory cells is accessed when the semiconductor memory device is requested to access the defective memory cell.

8. The method of claim 7, wherein the repair operation is a hard repair operation which, once repaired, is not reversed.

9. The method of claim 1, wherein entering into the repair mode and exiting the repair mode are performed by mode register set (MRS) programming operation.

10. The method of claim 1, wherein the semiconductor memory device is a dynamic random access memory (DRAM).

11. A method of repairing a semiconductor memory device including a plurality of banks, the method comprising:
   entering into a hard repair mode;
   receiving, during the hard repair mode, a hard repair command and a first address indicating a second memory cells in a second bank which includes a first defective memory cell;
   performing a hard repair operation to replace the first defective memory cell with a redundancy memory cell, the hard repair operation being performed by programming an anti-fuse set;
   receiving an auto-refresh command for refreshing a first memory cells in a first bank during the hard repair mode;
   performing an auto-refresh operation on the first memory cells in response to the auto-refresh command;
   exiting the hard repair mode;
   entering into a soft repair mode;
   receiving, in the soft repair mode, a soft repair command and a second address indicating a third memory cells in a third bank which includes a second defective memory cell;
   performing a soft repair operation to replace the second defective memory cell with a redundancy memory cell, the soft repair operation being performed by storing the second address in a storage unit;
   exiting the soft repair mode;
   wherein both the hard repair operation and the soft repair operation are post package repair (PPR) operations those are performed after the semiconductor memory device is packaged.

12. The method of claim 11, wherein the hard repair operation is not reversible.

13. The method of claim 11, wherein the soft repair operation is reversible by not using anti-fuse programming.

14. The method of claim 11, wherein the hard repair operation and the soft repair operation are not enabled at the same time.

15. The method of claim 11, wherein an auto-refresh operation is not performed during the soft repair operation.

16. The method of claim 11, wherein entering into the hard repair mode and exiting the hard repair mode are performed by mode register set (MRS) programming operation.

17. The method of claim 11, wherein the semiconductor memory device is a dynamic random access memory (DRAM).

* * * * *